(12) United States Patent
Gangi et al.

(10) Patent No.: US 12,027,618 B2
(45) Date of Patent: Jul. 2, 2024

(54) SEMICONDUCTOR DEVICE

(71) Applicant: KABUSHIKI KAISHA TOSHIBA, Tokyo (JP)

(72) Inventors: Hiro Gangi, Ota (JP); Yasunori Taguchi, Kawasaki (JP); Tomoaki Inokuchi, Yokohama (JP); Yusuke Kobayashi, Nagareyama (JP); Hiroki Nemoto, Fuchu (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 161 days.

(21) Appl. No.: 17/395,910

(22) Filed: Aug. 6, 2021

(65) Prior Publication Data

US 2022/0140133 A1 May 5, 2022

(30) Foreign Application Priority Data

Nov. 2, 2020 (JP) .................................. 2020-183591

(51) Int. Cl.
*H01L 29/78* (2006.01)
*H01L 29/40* (2006.01)

(52) U.S. Cl.
CPC ........ *H01L 29/7813* (2013.01); *H01L 29/407* (2013.01)

(58) Field of Classification Search
CPC ............. H01L 29/407; H01L 29/42368; H01L 29/7813
See application file for complete search history.

(56) References Cited

U.S. PATENT DOCUMENTS 9,716,009 B2  7/2017  Kobayashi et al.
10,453,930 B2 10/2019 Nishiguchi
(Continued)

FOREIGN PATENT DOCUMENTS

JP  2016-072482 A   5/2016
JP  2018-182258 A  11/2018
JP  2019-054071 A   4/2019

OTHER PUBLICATIONS

Kobayashi, K. et al. "100 V Class Multiple Stepped Oxide Field Plate Trench MOSFET (MOS-FP-MOSFET) Aimed to Ultimate Structure Realization", Proceedings of the 27th International Symposium on Power Semiconductor Devices & IC's May 10-14, 2015, Kowloon Shangri-La, Hong Kong, pp. 141-144.
(Continued)

*Primary Examiner* — Samuel A Gebremariam
*Assistant Examiner* — Jonas T Beardsley
(74) *Attorney, Agent, or Firm* — Oblon, McClelland, Maier & Neustadt, L.L.P.

(57) ABSTRACT

According to one embodiment, a semiconductor device includes first to third electrodes, a semiconductor member, a conductive member, and an insulating member. The semiconductor member includes first to third semiconductor regions. The first semiconductor region includes first and second partial regions. The second semiconductor region is between the first partial region and the third semiconductor region. The conductive member is located between the second partial region and the third electrode. The conductive member includes a first end portion and a first other-end portion. The first end portion is between the first other-end portion and the third electrode. The conductive member includes first to third portions. The second portion is between the third portion and the third electrode. The first portion is between the second portion and the third elec-
(Continued)

trode. The first portion includes the first end portion. The second portion contacts the first and third portions.

20 Claims, 6 Drawing Sheets

(56) References Cited

U.S. PATENT DOCUMENTS

| | | | |
|---|---|---|---|
| 2015/0162407 A1* | 6/2015 | Laven | H01L 29/7397 |
| | | | 257/655 |
| 2016/0093719 A1* | 3/2016 | Kobayashi | H01L 21/28008 |
| | | | 438/270 |
| 2017/0012118 A1* | 1/2017 | Park | H01L 29/7813 |
| 2019/0081173 A1 | 3/2019 | Nishiwaki et al. | |
| 2019/0334000 A1* | 10/2019 | Zundel | H01L 29/7813 |

OTHER PUBLICATIONS

Kobayashi, K. et al. "100-V Class Two-step-oxide Field-Plate Trench MOSFET to Achieve Optimum RESURF Effect and Ultralow On-resistance", Proceedings of the 31st International Symposium on Power Semiconductor Devices & ICs May 19-23, 2019, Shanghai, China, pp. 99-102.

* cited by examiner

SEMICONDUCTOR DEVICE

CROSS-REFERENCE TO RELATED APPLICATIONS

This application is based upon and claims the benefit of priority from Japanese Patent Application No. 2020-183591, filed on Nov. 2, 2020; the entire contents of which are incorporated herein by reference.

FIELD

Embodiments described herein relate generally to a semiconductor device.

BACKGROUND

For example, it is desirable to improve the characteristics of a semiconductor device such as a transistor or the like.

DETAILED DESCRIPTION

Figure 1:
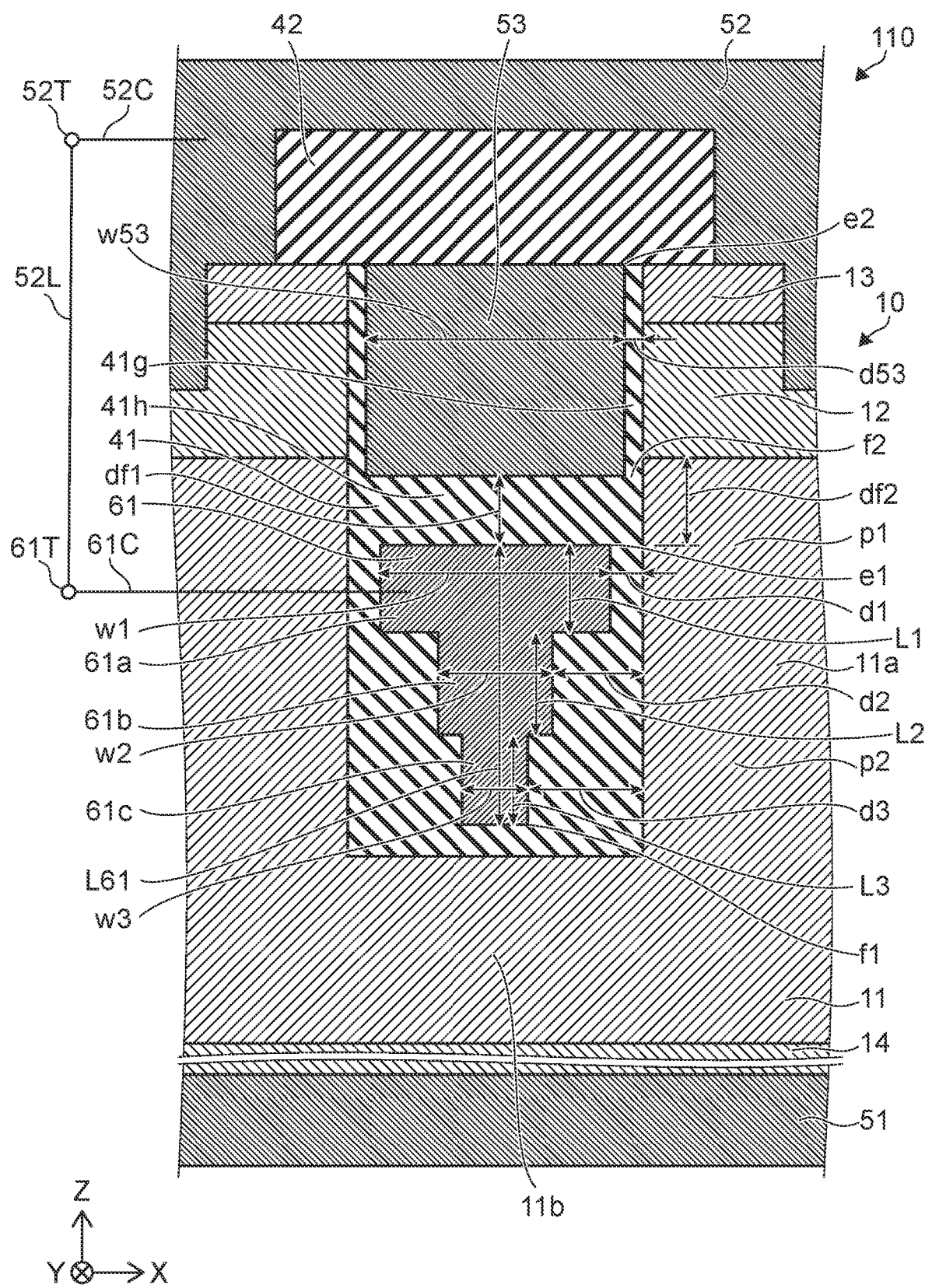
FIG. 1 is a schematic cross-sectional view illustrating a semiconductor device according to a first embodiment.

According to one embodiment, a semiconductor device includes a first electrode, a second electrode, a third electrode, a semiconductor member, a first conductive member, and a first insulating member. A direction from the first electrode toward the second electrode is along a first direction. The semiconductor member includes a first semiconductor region of a first conductivity type, a second semiconductor region of a second conductivity type, and a third semiconductor region of the first conductivity type. The first semiconductor region includes a first partial region and a second partial region. The second semiconductor region is between the first partial region and the third semiconductor region in the first direction. The first semiconductor region is electrically connected with the first electrode. The third semiconductor region is electrically connected with the second electrode. A second direction from a portion of the third electrode toward the second semiconductor region crosses the first direction. A direction from the second partial region toward the third electrode is along the first direction. The first conductive member is located between the second partial region and the third electrode. The first conductive member is electrically connected with the second electrode or is electrically connectable with the second electrode. A direction from the first conductive member toward the first partial region is along the second direction. The first conductive member includes a first end portion and a first other-end portion. The first end portion is between the first other-end portion and the third electrode. The first conductive member includes a first portion, a second portion, and a third portion. The second portion is between the third portion and the third electrode. The first portion is between the second portion and the third electrode. The first portion includes the first end portion. The second portion contacts the first and third portions. A first width along the second direction of the first portion is greater than a third width along the second direction of the third portion. A second width along the second direction of the second portion is between the first width and the third width. The first portion has a first length along the first direction. The second portion has a second length along the first direction. A ratio of a first ratio to a second ratio is not less than 2.5. The first ratio is a ratio of the first length to a first distance along the second direction between the first portion and the first partial region. The second ratio is a ratio of the second length to a second distance along the second direction between the second portion and the first partial region. At least a portion of the first insulating member is between the third electrode and the semiconductor member, between the first conductive member and the semiconductor member, and between the first conductive member and the third electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a semiconductor member 10, a first conductive member 61, and a first insulating member 41.

The direction from the first electrode 51 toward the second electrode 52 is along a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The semiconductor member 10 includes a first semiconductor region 11 of a first conductivity type, a second semiconductor region 12 of a second conductivity type, and a third semiconductor region 13 of the first conductivity type. For example, the first conductivity type is an n-type; and the second conductivity type is a p-type. According to the embodiment, the first conductivity type may be the p-type; and the second conductivity type may be the n-type. Hereinbelow, the first conductivity type is taken to be the n-type; and the second conductivity type is taken to be the p-type.

The first semiconductor region 11 includes a first partial region 11a and a second partial region 11b. The second semiconductor region 12 is between the first partial region 11a and the third semiconductor region 13 in the first direction (the Z-axis direction). The first semiconductor region 11 is electrically connected with the first electrode 51. The third semiconductor region 13 is electrically connected with the second electrode 52. For example, the second semiconductor region 12 is electrically connected with the second electrode 52.

A second direction from a portion of the third electrode 53 toward the second semiconductor region 12 crosses the first direction (the Z-axis direction). The second direction is, for example, the X-axis direction. The direction from the second partial region 11b toward the third electrode 53 is along the first direction (the Z-axis direction).

The first conductive member 61 is located between the second partial region 11b and the third electrode 53. The first conductive member 61 is electrically connected with the second electrode 52. Or, the first conductive member 61 is electrically connectable with the second electrode 52.

In one example, the first conductive member 61 is electrically connected with the second electrode 52 via a connection member 61C, a connection member 52L, and a connection member 52C. For example, the semiconductor device 110 may include a terminal 61T that is electrically connected with the first conductive member 61, and a terminal 52T that is electrically connected with the second electrode 52. The terminal 61T and the terminal 52T may be electrically connected by the connection member 52L. The semiconductor device 110 may include the connection member 52L. The connection member 52L may be provided separately from the semiconductor device 110.

The direction from the first conductive member 61 toward the first partial region 11a is along the second direction (e.g., the X-axis direction). The first conductive member 61 includes a first end portion e1 and a first other-end portion f1. The first end portion e1 and the first other-end portion f1 are end portions in the first direction (the Z-axis direction). The first end portion e1 is between the first other-end portion f1 and the third electrode 53. The first end portion e1 is the end portion at the third electrode 53 side. The first other-end portion f1 is the end portion at the second partial region 11b side.

The first conductive member 61 includes a first portion 61a, a second portion 61b, and a third portion 61c. The second portion 61b is between the third portion 61c and the third electrode 53. The first portion 61a is between the second portion 61b and the third electrode 53. The first portion 61a includes the first end portion e1 described above. The first portion 61a is the portion at the third electrode 53 side. The second portion 61b contacts the first and third portions 61a and 61c.

A first width w1 along the second direction (e.g., the X-axis direction) of the first portion 61a is greater than a third width w3 along the second direction of the third portion 61c. A second width w2 along the second direction of the second portion 61b is between the first width w1 and the third width w3. The first portion 61a has a first length L1 along the first direction (the Z-axis direction). The second portion 61b has a second length L2 along the first direction. The third portion 61c has a third length L3 along the first direction.

The distance along the second direction (the X-axis direction) between the first portion 61a and the first partial region 11a is taken as a first distance d1. The distance along the second direction between the second portion 61b and the first partial region 11a is taken as a second distance d2. The distance along the second direction between the third portion 61c and the first partial region 11a is taken as a third distance d3. For example, the second distance d2 is greater than the first distance d1. The third distance d3 is greater than the second distance d2.

According to the embodiment, the ratio of the first ratio to the second ratio is not less than 2.5. The first ratio is the ratio of the first length L1 to the first distance d1 (i.e., L1/d1). The second ratio is the ratio of the second length L2 to the second distance d2 (i.e., L2/d2).

At least a portion of the first insulating member 41 is between the third electrode 53 and the semiconductor member 10, between the first conductive member 61 and the semiconductor member 10, and between the first conductive member 61 and the third electrode 53. The first insulating member 41 electrically insulates the third electrode 53, the first conductive member 61, and the semiconductor member 10 from each other. For example, a portion 41g of the first insulating member 41 is between the third electrode 53 and the second semiconductor region 12. For example, another portion 41h of the first insulating member 41 is between the first conductive member 61 and the third electrode 53.

The current that flows between the first electrode 51 and the second electrode 52 can be controlled by the potential of the third electrode 53. The potential of the third electrode 53 is, for example, a potential that is referenced to the potential of the second electrode 52. The first electrode 51 is, for example, a drain electrode. The second electrode 52 is, for example, a source electrode. The third electrode 53 is a gate electrode. The semiconductor device 110 is, for example, a transistor.

For example, the first conductive member 61 functions as a field plate. The concentration of the electric field can be suppressed by providing the first conductive member 61. For example, a high breakdown voltage is easily obtained thereby.

According to the embodiment, the first-conductivity-type carrier concentration in the third semiconductor region 13 is greater than the first-conductivity-type carrier concentration in the first semiconductor region 11. For example, the first-conductivity-type impurity concentration in the third semiconductor region 13 is greater than the first-conductivity-type impurity concentration in the first semiconductor region 11. The first semiconductor region 11 is, for example, an n-region or an n$^-$-region. The third semiconductor region 13 is, for example, an n$^+$-region.

As shown in FIG. 1, the semiconductor member 10 may further include a fourth semiconductor region 14 of the first conductivity type. The fourth semiconductor region 14 is located between the first electrode 51 and the first semiconductor region 11. The first-conductivity-type carrier concentration in the fourth semiconductor region 14 is greater than the first-conductivity-type carrier concentration in the first semiconductor region 11. For example, the first-conductivity-type impurity concentration in the fourth semiconductor region 14 is greater than the first-conductivity-type impurity concentration in the first semiconductor region 11. The fourth semiconductor region 14 is, for example, an n$^+$-region. The fourth semiconductor region 14 may be a semiconductor substrate.

In the example as shown in FIG. 1, the semiconductor device 110 further includes a second insulating member 42. The second insulating member 42 is located between the third electrode 53 and the second electrode 52. The second insulating member 42 electrically insulates the third and second electrodes 53 and 52 from each other.

In embodiments as described above, the ratio of the first ratio to the second ratio is not less than 2.5. For example, it was found that a high breakdown voltage and a low on-resistance are obtained thereby.

An example of simulation results of characteristics of the semiconductor device will now be described. The firstconductivity-type impurity concentration in the first semiconductor region 11 is taken to be uniform in the model of the simulation. When the impurity concentration of the first conductivity type (e.g., the n-type) of the first semiconductor region 11 is uniform, the manufacturing is easy and practical.

FIGS. 2A, 2B, 3A, 3B, 4A, and 4B are graphs illustrating characteristics of the semiconductor device.

Figure 2A:
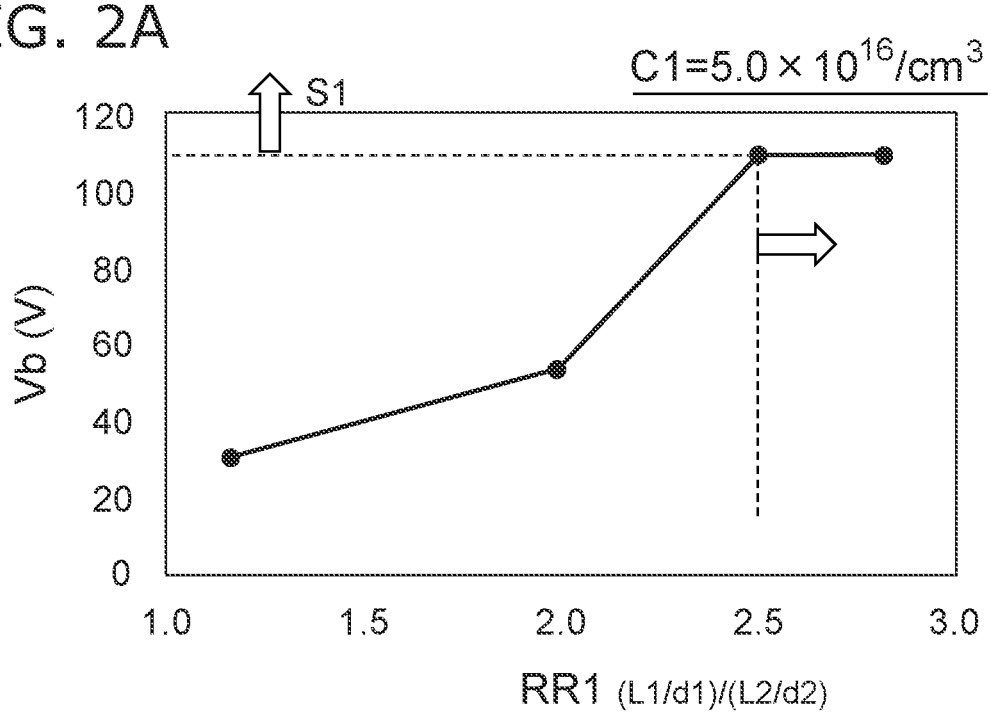
FIGS. 2A and 2B are graphs illustrating characteristics of the semiconductor device.
Figure 2B:
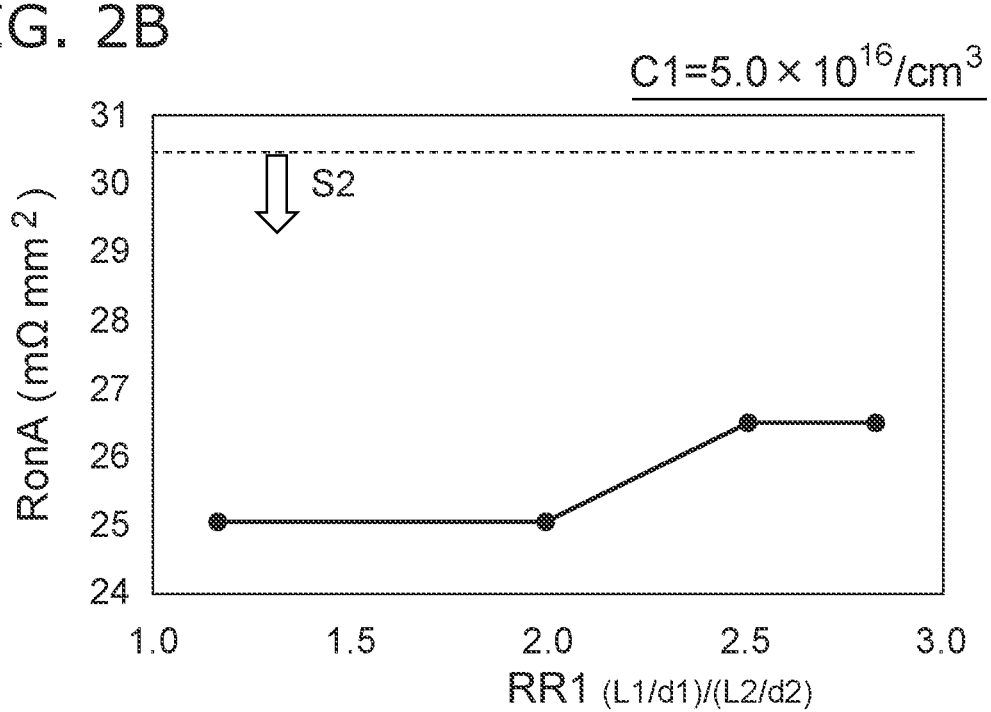
Figure 3A:
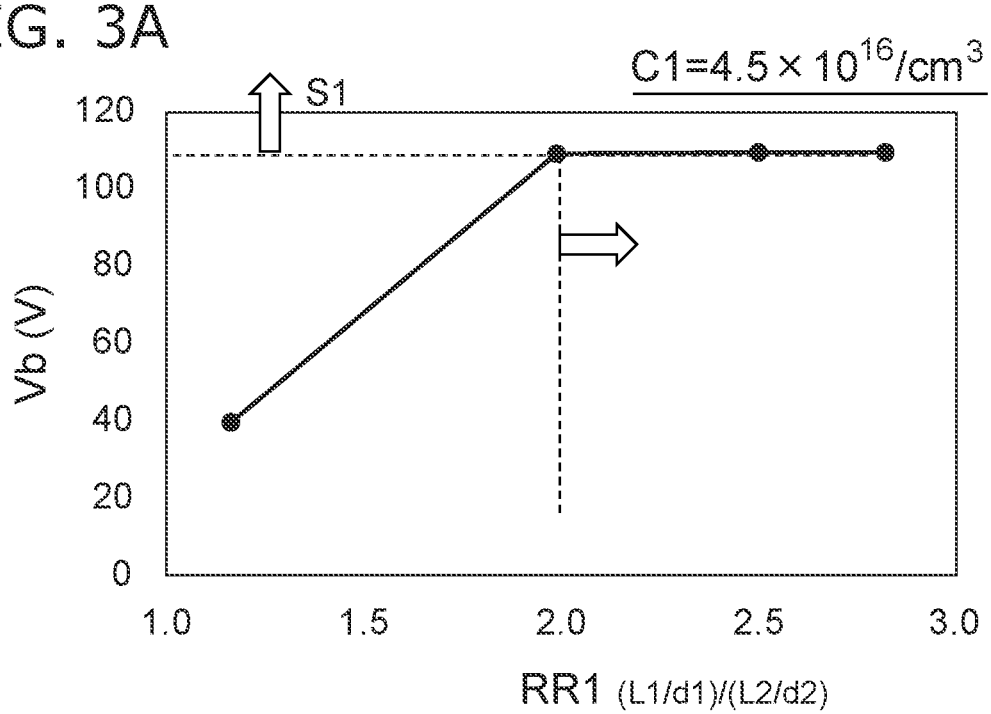
FIGS. 3A and 3B are graphs illustrating characteristics of the semiconductor device.
Figure 3B:
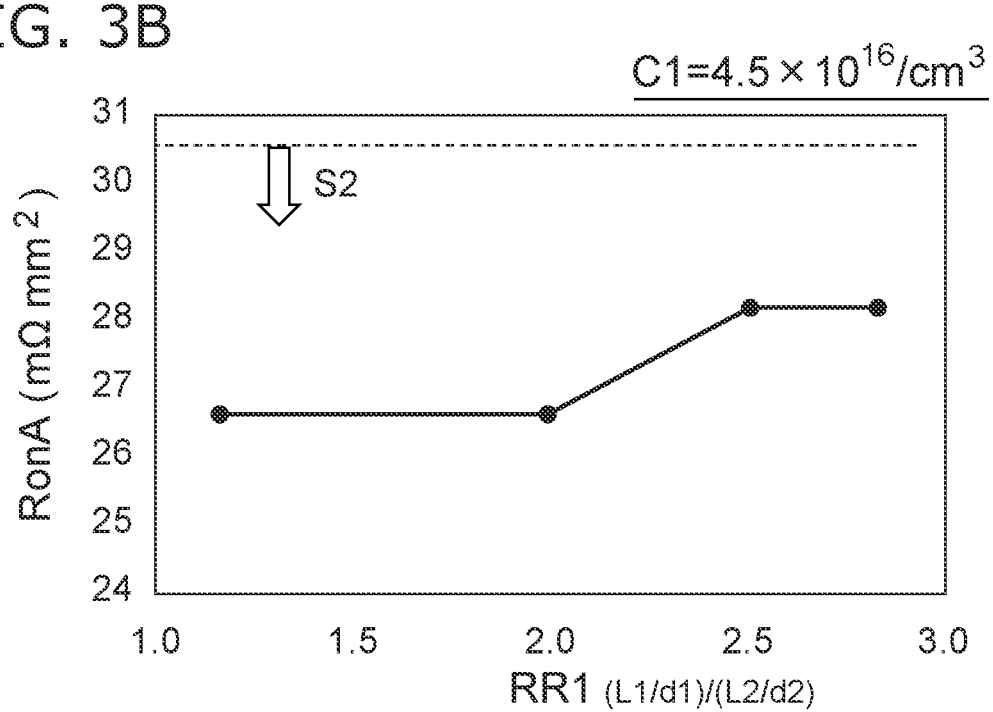
Figure 4A:
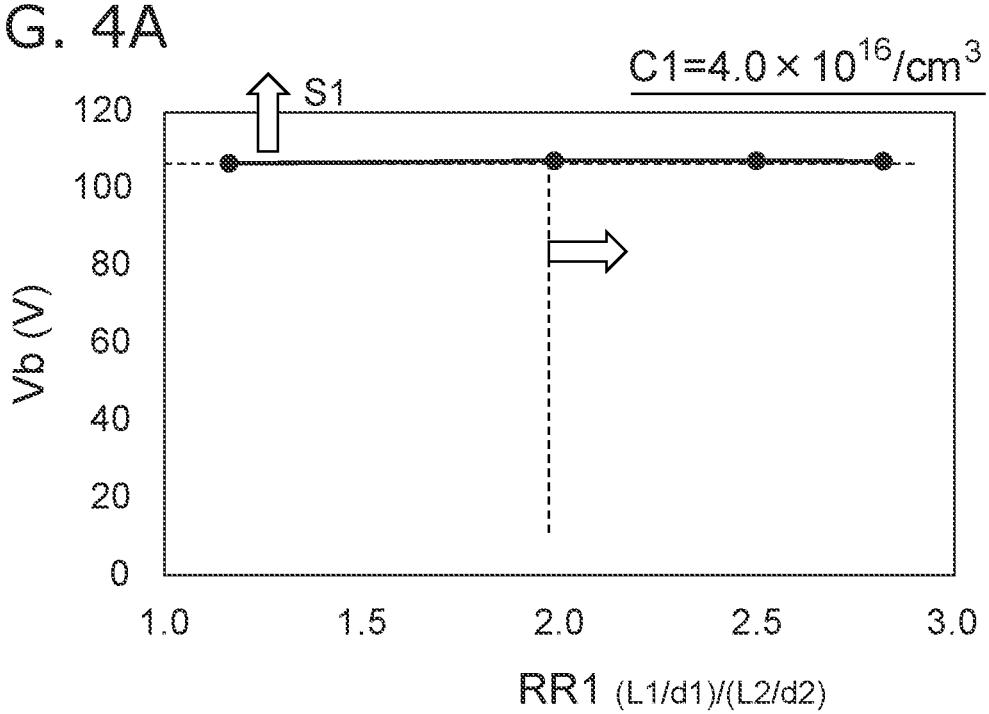
FIGS. 4A and 4B are graphs illustrating characteristics of the semiconductor device.
Figure 4B:
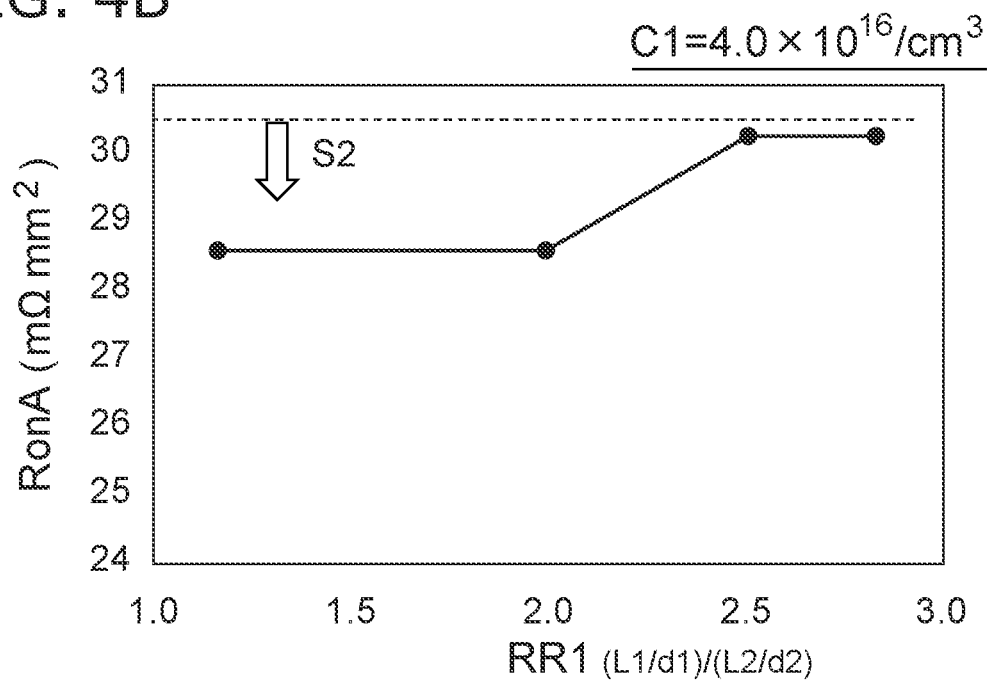

In FIGS. 2A and 2B, an n-type impurity concentration C1 in the first semiconductor region 11 is $5.0 \times 10^{16}/\text{cm}^3$. In FIGS. 3A and 3B, the impurity concentration C1 is $4.5 \times 10^{16}/\text{cm}^3$. In FIGS. 4A and 4B, the impurity concentration C1 is $4.0 \times 10^{16}/\text{cm}^3$. In FIGS. 2A, 2B, 3A, 3B, 4A, and 4B, the horizontal axis is a ratio RR1 of the first ratio to the second ratio. The ratio RR1 is (L1/d1)/(L2/d2). In FIGS. 2A, 3A, and 4A, the vertical axis is a breakdown voltage Vb. In FIGS. 2B, 3B, and 4B, the vertical axis is an on-resistance RonA.

As shown in FIG. 2A, a high breakdown voltage Vb is obtained when the ratio RR1 is high. As shown in FIG. 2B, the on-resistance RonA increases when the ratio RR1 is high. For example, when 110 V is employed as a reference value S1 relating to the breakdown voltage Vb, a breakdown voltage Vb that is not less than the reference value S1 is obtained when the ratio RR1 is not less than 2.5. For example, when 30.5 mΩmm² is employed as a reference value S2 relating to the on-resistance RonA, an on-resistance RonA that is not more than the reference value S2 is obtained regardless of the ratio RR1. When the n-type impurity concentration C1 in the first semiconductor region 11 is $5.0 \times 10^{16}/\text{cm}^3$, for example, it is favorable for the ratio RR1 to be not less than 2.5.

In the example shown in FIGS. 3A and 3B as well, a high breakdown voltage Vb is obtained when the ratio RR1 is high. The on-resistance RonA increases when the ratio RR1 is high. A breakdown voltage Vb that is not less than the reference value S1 is obtained when the ratio RR1 is not less than 2.0. An on-resistance RonA that is not more than the reference value S2 is obtained regardless of the ratio RR1. When the n-type impurity concentration C1 in the first semiconductor region 11 is $4.5 \times 10^{16}/\text{cm}^3$, for example, it is favorable for the ratio RR1 to be not less than 2.0.

As shown in FIG. 4A, when the impurity concentration C1 is $4.0 \times 10^{16}/\text{cm}^3$, a high breakdown voltage Vb is obtained substantially independently of the ratio RR1. When 110 V is employed as the reference value S1 of the breakdown voltage Vb, a breakdown voltage Vb that is not less than the reference value S1 is obtained when the ratio RR1 is not less than about 2.0.

As shown in FIG. 4B, the on-resistance RonA increases when the ratio RR1 is high. When 30.5 mΩmm² is employed as the reference value S2 relating to the on-resistance RonA, an on-resistance RonA that is not more than the reference value S2 is obtained regardless of the ratio RR1.

According to the embodiment, a high breakdown voltage Vb and a low on-resistance RonA are obtained by setting the ratio RR1 to be not less than 2.5. According to the embodiment, a semiconductor device can be provided in which the characteristics can be improved.

For example, when the impurity concentration C1 is not less than $4.2 \times 10^{16}/\text{cm}^3$, the characteristics have trends similar to when the impurity concentration C1 is not less than $4.5 \times 10^{16}/\text{cm}^3$. Accordingly, according to the embodiment, it is favorable for the impurity concentration C1 to be not less than $4.2 \times 10^{16}/\text{cm}^3$. A high breakdown voltage Vb and a low on-resistance RonA are more stably obtained thereby.

According to the embodiment, for example, the breakdown voltage easily decreases when the impurity concentration C1 exceeds $5.6 \times 10^{16}/\text{cm}^3$. According to the embodiment, it is favorable for the impurity concentration C1 to be not more than $5.6 \times 10^{16}/\text{cm}^3$. The decrease of the breakdown voltage can be suppressed thereby.

The first ratio is "L1/d1". The first ratio is a value that corresponds to the electrostatic capacitance generated in the first portion 61a. The second ratio is "L2/d2". The second ratio is a value that corresponds to the electrostatic capacitance generated in the second portion 61b. Accordingly, the ratio RR1 corresponds to the ratio of the electrostatic capacitances of the first and second portions 61a and 61b.

In the first conductive member 61, the first portion 61a is most proximate to the first semiconductor region 11. The first semiconductor region 11 includes a region that faces the lower end of the first portion 61a that is most proximate to the first semiconductor region 11. By controlling the ratio RR1, the electric field in "the region that faces the lower end" can be controlled. The electric field in "the region that faces the lower end" is stronger when the ratio RR1 is high compared to when the ratio RR1 is low. Thereby, the electric field distribution of the first semiconductor region 11 is more uniform. A high breakdown voltage is obtained.

The effect of the electric field in "the region that faces the lower end" being increased by the first portion 61a is obtained by the electric field easily concentrating at the corners of the conductive member. The electric field is greatly dependent on the electrostatic capacitance ratio RR1 of the first portion 61a and the second portion 61b that form corners. For example, the electric field is not greatly dependent on the electrostatic capacitance of the third portion 61c that is separated from the corners. Therefore, practically, by appropriately controlling the ratio RR1, a high breakdown voltage Vb is obtained while maintaining a low on-resistance RonA.

As described above, the productivity is reduced by changing the impurity concentration C1 of the first conductivity type in the first semiconductor region 11. According to the embodiment, the impurity concentration C1 of the first conductivity type in the first semiconductor region 11 may be substantially uniform.

For example, as shown in FIG. 1, the first partial region 11a includes a first position p1 and a second position p2. The direction from the first end portion e1 of the first conductive member 61 toward the first position p1 is along the second direction (e.g., the X-axis direction). The direction from the first other-end portion f1 toward the second position p2 is along the second direction. For example, the level of the first position p1 referenced to the first electrode 51 corresponds to the level of the upper end of the first conductive member 61 referenced to the first electrode 51. For example, the level of the second position p2 referenced to the first electrode 51 corresponds to the level of the lower end of the first conductive member 61 referenced to the first electrode 51. The first impurity concentration of the first conductivity type at the first position p1 may be substantially equal to the second impurity concentration of the first conductivity type at the second position p2. For example, the first impurity concentration is not less than 0.8 times and not more than 1.2 times the second impurity concentration. By setting the impurity concentration to be substantially uniform, the semiconductor device is obtained with high productivity. Among such conditions, it is favorable for the impurity concentration C1 to be not less than $4.2 \times 10^{16}/\text{cm}^3$. By setting the ratio RR1 to be not less than 2.5, a high breakdown voltage and a low on-resistance are obtained.

According to the embodiment, it is favorable for the ratio RR1 to be not more than 8. For example, the breakdown voltage easily decreases when the ratio RR1 is excessively high. By setting the ratio RR1 to be not more than 8, the decrease of the breakdown voltage can be suppressed.

As shown in FIG. 1, the width along the second direction (e.g., the X-axis direction) of the third electrode 53 is taken as a width w53. The first width w1 of the first portion 61a of the first conductive member 61 is less than the width w53 along the second direction of the third electrode 53.

As shown in FIG. 1, the distance along the second direction (e.g., the X-axis direction) between the third electrode 53 and the second semiconductor region 12 is taken as a distance d53. The distance d53 corresponds to the thickness of the first insulating member 41 between the third electrode 53 and the second semiconductor region 12. It is favorable for the first distance d1 to be not less than 1.1 times and not more than 3.2 times the distance d53. By setting the first distance d1 to be not less than 1.1 times the distances d53, for example, the breakdown voltage is easily increased. By setting the first distance d1 to be not more than 3.2 times the distances d53, for example, the breakdown voltage is easily increased. The distance d53 is, for example, not less than 25 nm and not more than 100 nm. For example, the distance d53 corresponds to the thickness of the gate insulating film.

In one example, the first distance d1 is less than the second distance d2. The first length L1 is greater than the second length L2.

In one example, the first length L1 is not less than 1.1 times and not more than 2.4 times the second length L2. In one example, the first distance d1 is not less than 0.4 times and not more than 0.6 times the second distance d2.

As shown in FIG. 1, the length along the first direction (the Z-axis direction) of the first conductive member 61 is taken as a length L61. It is favorable for the first length L1 to be not less than 0.1 times and not more than 0.3 times the length L61. By setting the first length L1 to be not less than 0.1 times the length L61, for example, the breakdown voltage is easily increased. By setting the first length L1 to be not more than 0.3 times the length L61, for example, the breakdown voltage is easily increased. For example, the second length L2 is not less than 0.1 times and not more than 0.2 times the length L61.

As shown in FIG. 1, the third electrode 53 includes a second end portion e2 and a second other-end portion f2. The second other-end portion f2 is between the first conductive member 61 and the second end portion e2 in the first direction (the Z-axis direction). The distance along the first direction between the first electrode 51 and the second other-end portion f2 is less than the distance along the first direction between the first electrode 51 and the second semiconductor region 12. In other words, when referenced to the first electrode 51, the level of the second other-end portion f2 is lower than the level of the lower end of the second semiconductor region 12. The distance along the first direction between the first electrode 51 and the second end portion e2 is greater than the distance along the first direction between the first electrode 51 and the third semiconductor region 13. In other words, when referenced to the first electrode 51, the level of the second other-end portion f2 is higher than the level of the lower end of the third semiconductor region 13. An appropriate switching operation is obtained.

As shown in FIG. 1, the distance along the first direction (the Z-axis direction) between the first end portion e1 and the third electrode 53 is taken as a distance df1. The distance along the first direction (the Z-axis direction) between the first position p1 and the second semiconductor region 12 is taken as a distance df2. The distance df2 corresponds to the distance along the first direction between the first end portion e1 and the second semiconductor region 12. The distance df1 is less than the distance df2. An appropriate switching operation is obtained thereby. It is favorable for the distance df1 to be not less than 0.6 times and not more than 0.95 times the distance df2. By setting the distance df1 to be not less than 0.6 times the distance df2, for example, the breakdown voltage is easily increased. By setting the distance df1 to be not more than 0.95 times the distance df2, for example, the on-resistance RonA is easily reduced.

For example, it is favorable for the first distance d1 to be not less than 0.1 times and not more than 0.5 times the distance (i.e., the distance df2) along the first direction between the first end portion e1 and the second semiconductor region 12.

It is favorable for the distance df1 (the distance along the first direction between the first end portion e1 and the third electrode 53) to be greater than the first distance d1. For example, it is favorable for the distance df1 to be not less than 2 times the first distance d1. An example of the relationship between the distance df1 and the first distance d1 will now be described.

Figure 5A:
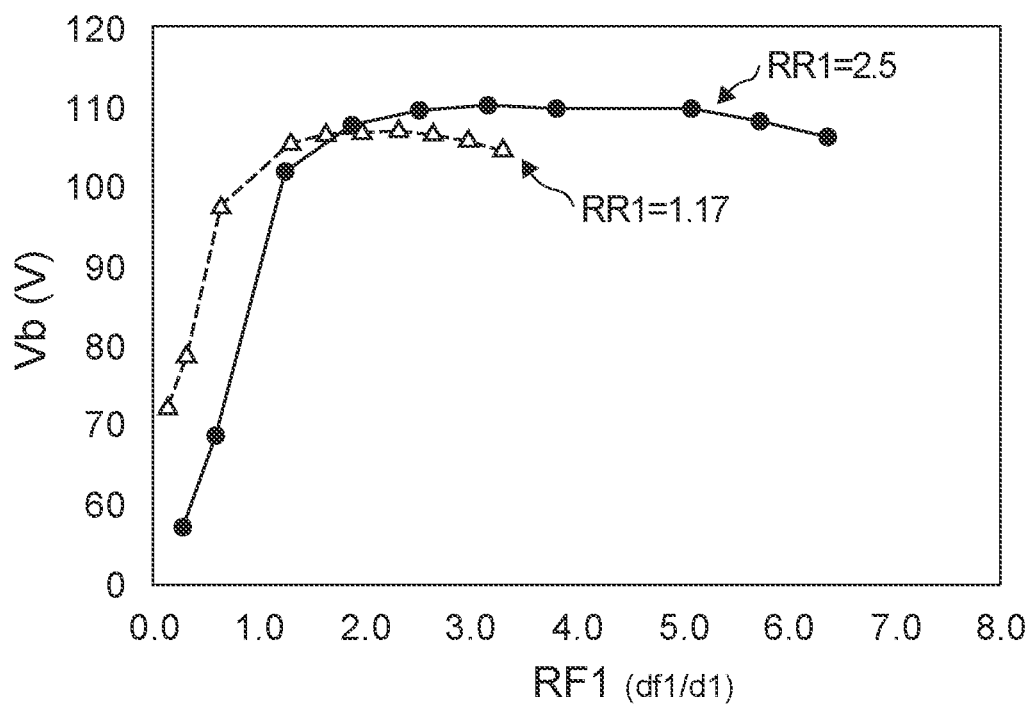
FIGS. 5A and 5B are graphs illustrating characteristics of the semiconductor device.
Figure 5B:
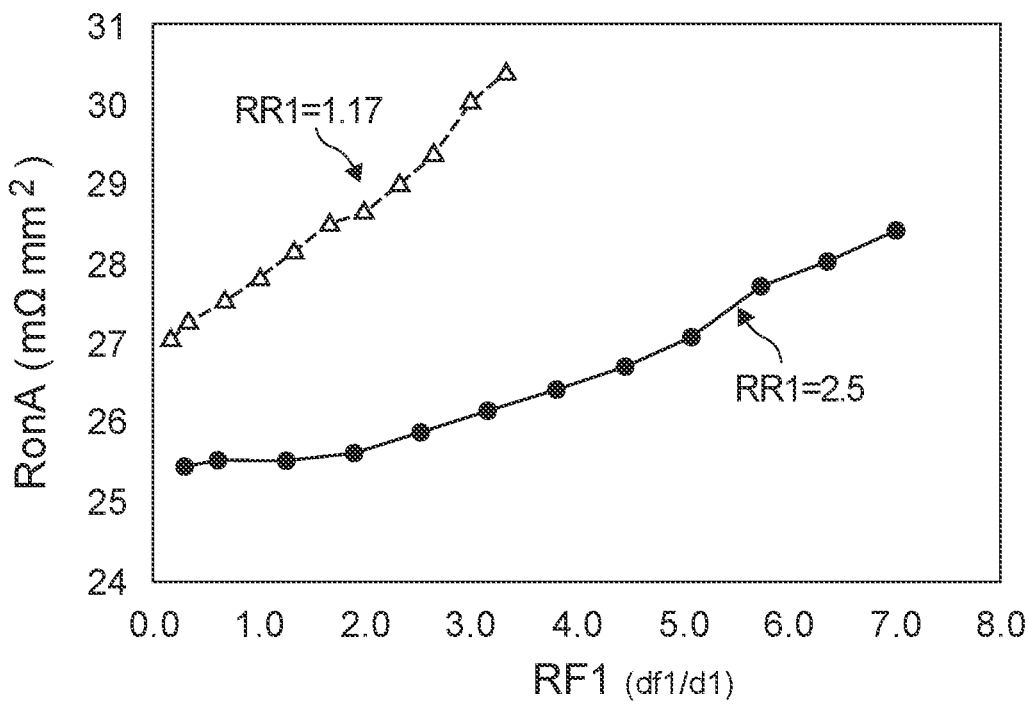

FIGS. 5A and 5B are graphs illustrating characteristics of the semiconductor device.

In FIGS. 5A and 5B, the horizontal axis is a ratio RF1 of the distance df1 to the first distance d1. The ratio RF1 is df1/d1. The vertical axis of FIG. 5A is the breakdown voltage Vb. The vertical axis of FIG. 5B is the on-resistance RonA. These figures show cases where the ratio RR1 is 1.17 and 2.5.

As shown in FIG. 5B, a low on-resistance RonA is obtained when the ratio RF1 is low for either ratio RR1. For the same RF1, the on-resistance RonA when the ratio RR1 is 2.5 is much less than the on-resistance RonA when the ratio RR1 is 1.17.

As shown in FIG. 5A, the breakdown voltage Vb is low when the ratio RF1 is excessively low for either ratio RR1.

When the ratio RR1 is 1.17 and the ratio RF1 is less than 2, a low on-resistance RonA and a high breakdown voltage Vb are obtained.

When the ratio RR1 is 2.5 and the ratio RF1 is not less than 2, a very low on-resistance RonA and a high breakdown voltage Vb are obtained. Accordingly, the ratio RF1 may be not less than 2 when the ratio RR1 is 2.5. When the ratio RR1 is 2.5, the ratio RF1 may be about 5 because the on-resistance RonA is very low.

According to the embodiment, it is favorable for the ratio RF1 of the distance df1 (the distance along the first direction between the first end portion e1 and the third electrode 53) to the first distance d1 to be not less than 2. A high breakdown voltage Vb and a low on-resistance RonA are obtained thereby. It is favorable for the ratio RF1 to be not more than 5. A high breakdown voltage Vb and a low on-resistance RonA are obtained. As described above, these relationships have a special condition of the ratio RR1 being not less than 2.5.

As shown in FIG. 1, the third portion 61c has the third length L3 along the first direction (the Z-axis direction). The distance along the second direction (the X-axis direction) between the third portion 61c and the first partial region 11a is taken as the third distance d3. The ratio of the third length L3 to the third distance d3 is taken as a third ratio. The third ratio is L3/d3. The second ratio described above is L2/d2. According to the embodiment, the ratio of the second ratio to the third ratio may be not less than 0.2 and not more than 1.2. When the ratio RR1 described above is not less than 2.5, a high breakdown voltage Vb and a low on-resistance RonA are obtained without being greatly dependent on the ratio of the second ratio to the third ratio.

For example, the ratio of the second ratio to the third ratio may be not less than 0.25 times and not more than 3 times the ratio RR1 of the first ratio to the second ratio. As described above, the first semiconductor region 11 includes "the region that faces the lower end" of the first portion 61a that is most proximate to the first semiconductor region 11. The effect of increasing the electric field in "the region that faces the lower end" is greatly dependent on the electrostatic capacitance ratio RR1 of the first portion 61a and the second portion 61b that form the corners. For example, a high breakdown voltage Vb and a low on-resistance RonA are obtained without being greatly dependent on the ratio of the second ratio to the third ratio.

Second Embodiment

Figure 6:
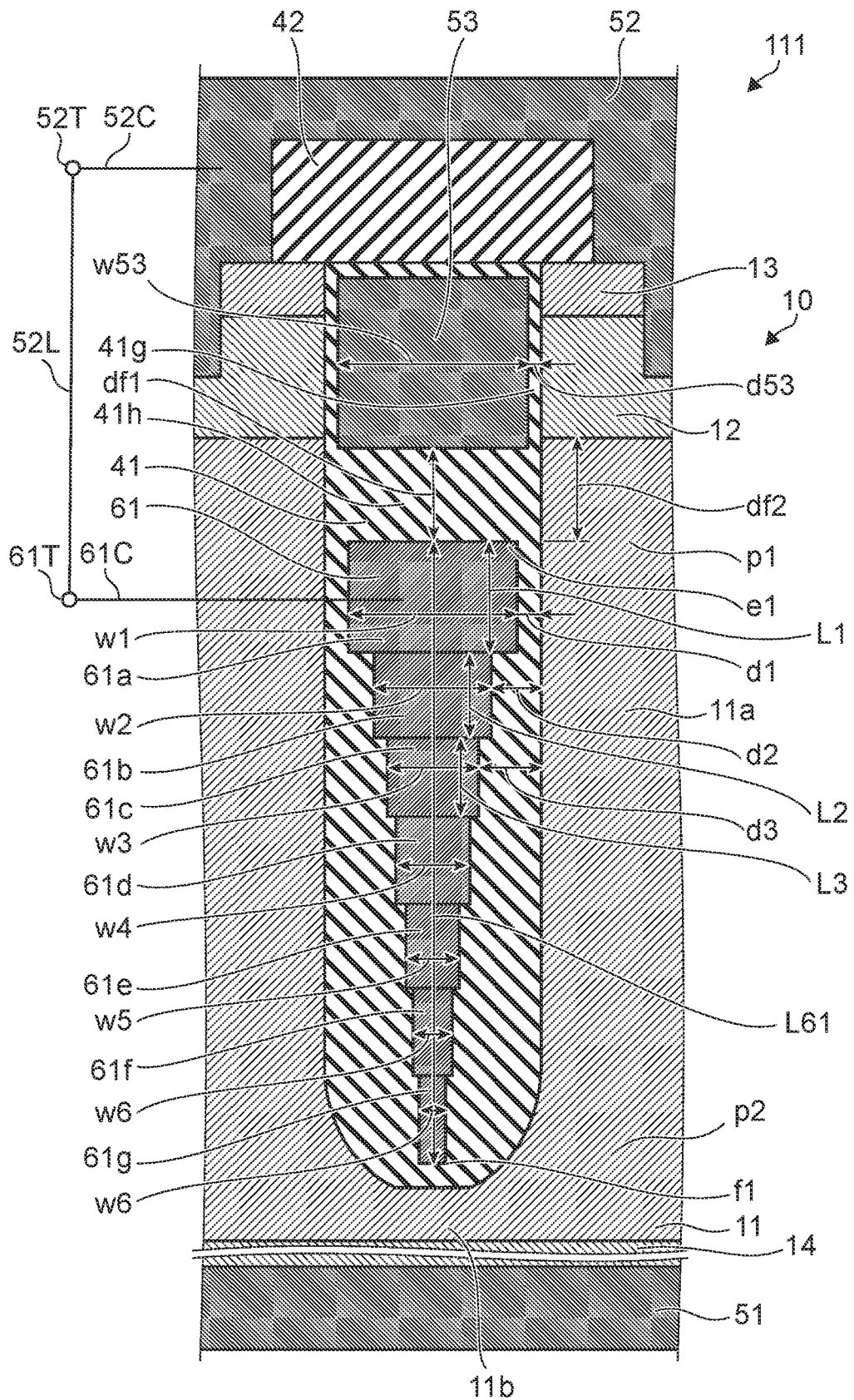
FIG. 6 is a schematic cross-sectional view illustrating a semiconductor device according to a second embodiment.

FIG. 6 is a schematic cross-sectional view illustrating a semiconductor device according to a second embodiment.

In the semiconductor device 111 according to the embodiment as shown in FIG. 6, the first conductive member 61 further includes other portions in addition to the first to third portions 61a to 61c. Otherwise, the configuration of the semiconductor device 111 may be similar to the configuration of the semiconductor device 110.

For example, in the semiconductor device 111, the semiconductor member 10 includes fourth to seventh portions 61d to 61g. The fourth portion 61d is between the first electrode 51 and the third portion 61c in the first direction (the Z-axis direction). The fifth portion 61e is between the first electrode 51 and the fourth portion 61d in the first direction. The sixth portion 61f is between the first electrode 51 and the fifth portion 61e in the first direction. The seventh portion 61g is between the first electrode 51 and the sixth portion 61f in the first direction.

A fourth width w4 along the second direction (the X-axis direction) of the fourth portion 61d is less than the third width w3. A fifth width w5 along the second direction of the fifth portion 61e is less than the fourth width w4. A sixth width w6 along the second direction of the sixth portion 61f is less than the fifth width w5. A seventh width w7 along the second direction of the seventh portion 61g is less than the sixth width w6.

In the semiconductor device 110 as well, the ratio RR1 is, for example, not less than 2.5. A high breakdown voltage Vb and a low on-resistance RonA are obtained.

In embodiments described above, it is favorable for the second-conductivity-type carrier concentration in the second semiconductor region 12 to be not less than $1.0 \times 10^{17}/cm^3$ and not more than $1.0 \times 10^{18}/cm^3$. It is favorable for the first-conductivity-type carrier concentration in the third semiconductor region 13 to be not less than $1.0 \times 10^{18}/cm^3$ and not more than $1.0 \times 10^{20}/cm^3$. It is favorable for the first-conductivity-type carrier concentration in the fourth semiconductor region 14 to be not less than $1.0 \times 10^{18}/cm^3$ and not more than $1.0 \times 10^{20}/cm^3$. The concentration of the impurity in the semiconductor region may be substantially equal to the carrier concentration in the semiconductor region.

The semiconductor member includes, for example, silicon. The semiconductor member may include, for example, a compound semiconductor, etc. The first electrode 51 includes, for example, at least one selected from the group consisting of aluminum, titanium, nickel, and gold. The second electrode 52 includes, for example, at least one selected from the group consisting of aluminum, titanium, nickel, and gold. The third electrode 53 and the first conductive member 61 include, for example, conductive silicon or polysilicon. The first insulating member 41 and the second insulating member 42 include, for example, at least one selected from the group consisting of silicon oxide, silicon nitride, and silicon oxynitride.

In embodiments, information that relates to the configurations of the semiconductor regions, etc., is obtained by, for example, electron microscopy, etc. Information that relates to the impurity concentrations of the semiconductor regions is obtained by, for example, EDX (Energy Dispersive X-ray Spectroscopy), SIMS (Secondary Ion Mass Spectrometry), etc. Information that relates to the carrier concentrations of the semiconductor regions is obtained by, for example, SCM (Scanning Capacitance Microscopy), etc.

According to embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the first electrode toward the second electrode being along a first direction;
   a semiconductor member, the semiconductor member including a first semiconductor region of a first conductivity type, a second semiconductor region of a second conductivity type, and a third semiconductor region of the first conductivity type, the first semiconductor region including a first partial region and a second partial region, the second semiconductor region being between the first partial region and the third semiconductor region in the first direction, the first semiconductor region being electrically connected with the first electrode, the third semiconductor region being electrically connected with the second electrode;

a third electrode, a second direction from a portion of the third electrode toward the second semiconductor region crossing the first direction, a direction from the second partial region toward the third electrode being along the first direction;

a first conductive member located between the second partial region and the third electrode, the first conductive member being electrically connected with the second electrode or being electrically connectable with the second electrode, a direction from the first conductive member toward the first partial region being along the second direction, the first conductive member including a first end portion and a first other-end portion, the first end portion being between the first other-end portion and the third electrode, the first conductive member including a first portion, a second portion, and a third portion, each of the first, second, and third portions having a uniform width, the second portion being between the third portion and the third electrode, the first portion being between the second portion and the third electrode, the first portion including the first end portion, the second portion directly contacting the first and third portions, a first width along the second direction of the first portion being greater than a third width along the second direction of the third portion, a second width along the second direction of the second portion being between the first width and the third width, the first portion having a first length along the first direction, the second portion having a second length along the first direction, a ratio of a first ratio to a second ratio being not less than 2.5, the first ratio being a ratio of the first length to a first distance along the second direction between the first portion and the first semiconductor region, the second ratio being a ratio of the second length to a second distance along the second direction between the second portion and the first semiconductor region, wherein the first length is not less than 1.1 times and not more than 2.4 times the second length; and a first insulating member, at least a portion of the first insulating member being between the third electrode and the semiconductor member, between the first conductive member and the semiconductor member, and between the first conductive member and the third electrode.

2. The device according to claim 1, wherein the ratio of the first ratio to the second ratio is not more than 8.

3. The device according to claim 1, wherein
the first partial region includes a first position and a second position,
a direction from the first end portion toward the first position is along the second direction,
a direction from the first other-end portion toward the second position is along the second direction, and
a first impurity concentration of the first conductivity type at the first position is not less than 0.8 times and not more than 1.2 times a second impurity concentration of the first conductivity type at the second position.

4. The device according to claim 3, wherein the first impurity concentration is not less than $4.2 \times 10^{16}/cm^3$ and not more than $5.6 \times 10^{16}/cm^3$.

5. The device according to claim 1, wherein the first width is less than a width along the second direction of the third electrode.

6. The device according to claim 1, wherein the first length is not less than 0.1 times and not more than 0.3 times a length along the first direction of the first conductive member.

7. The device according to claim 6, wherein the second length is not less than 0.1 times and not more than 0.2 times the length along the first direction of the first conductive member.

8. The device according to claim 1, wherein the first distance is less than the second distance.

9. The device according to claim 1, wherein the first distance is not less than 1.1 times and not more than 3.2 times a distance along the second direction between the third electrode and the second semiconductor region.

10. The device according to claim 1, wherein a ratio of a distance along the first direction between the first end portion and the third electrode to the first distance is not less than 2.

11. The device according to claim 1, wherein a distance along the first direction between the first end portion and the third electrode is less than a distance along the first direction between the first position and the second semiconductor region.

12. The device according to claim 1, wherein the first distance is not less than 0.1 times and not more than 0.5 times a distance along the first direction between the first end portion d the second semiconductor region.

13. The device according to claim 1, wherein
the third electrode includes a second end portion and a second other-end portion,
the second other-end portion is between the first conductive member and the second end portion in the first direction,
a distance along the first direction between the first electrode and the second other-end portion is less than a distance along the first direction between the first electrode and the second semiconductor region, and
a distance along the first direction between the first electrode and the second end portion is greater than a distance along the first direction between the first electrode and the third semiconductor region.

14. The device according to claim 1, wherein the first length is not less than 1.1 times and not more than 1.4 times the second length.

15. The device according to claim 1, wherein the first distance is not less than 0.4 times and not more than 0.6 times the second distance.

16. The device according to claim 1, wherein
the third portion has a third length along the first direction,
a ratio of the second ratio to a third ratio is not less than 0.2, and
the third ratio is a ratio of the third length to a third distance along the second direction between the third portion and the first partial region.

17. The device according to claim 1, wherein the ratio of the second ratio to the third ratio is not less than 0.25 times and not more than 3 times the ratio of the first ratio to the second ratio.

18. The device according to claim 1, wherein a carrier concentration of the first conductivity type in the third semiconductor region is greater than a carrier concentration of the first conductivity type in the first semiconductor region.

19. The device according to claim 18, wherein
the semiconductor member further includes a fourth semiconductor region of the first conductivity type,
the fourth semiconductor region is located between the first electrode and the first semiconductor region, and
a carrier concentration of the first conductivity type in the fourth semiconductor region is greater than the carrier concentration of the first conductivity type in the first semiconductor region.

20. The device according to claim 1, wherein
the first conductive member further includes a fourth portion,
the fourth portion is between the first electrode and the third portion in the first direction, and
a fourth width along the second direction of the fourth portion is less than the third width.

* * * * *